(12) United States Patent
Funaki et al.

(10) Patent No.: US 6,791,277 B2
(45) Date of Patent: Sep. 14, 2004

(54) LIGHT EMITTING ELEMENT AND PRODUCTION PROCESS THEREOF

(75) Inventors: Jun Funaki, Saitama-Ken (JP); Satoshi Miyaguchi, Saitama-Ken (JP); Yoshiyuki Okuda, Saitama-Ken (JP); Yoshihiro Ushigusa, Saitama-Ken (JP); Masami Tsuchida, Saitama-Ken (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 09/799,123

(22) Filed: Mar. 6, 2001

(65) Prior Publication Data

US 2001/0020819 A1 Sep. 13, 2001

(30) Foreign Application Priority Data

Mar. 7, 2000  (JP) .......................................... 2000-067185

(51) Int. Cl.⁷ ............................. H05B 33/00; B05D 5/12
(52) U.S. Cl. .................................... 315/169.3; 313/504
(58) Field of Search .......................... 315/169.3, 200 R, 315/169.1, 169.4; 345/76, 44, 46, 55, 211, 212, 82, 77; 313/504, 506; 257/88, 80, 81, 84

(56) References Cited

U.S. PATENT DOCUMENTS

| | | | | |
|---|---|---|---|---|
| 5,747,930 A | * | 5/1998 | Utsugi ......................... 313/504 |
| 5,828,181 A | * | 10/1998 | Okuda ..................... 315/169.3 |
| 6,028,327 A | * | 2/2000 | Mizoguchi et al. ......... 257/103 |
| 6,310,589 B1 | * | 10/2001 | Nishigaki et al. ............. 345/76 |
| 6,320,322 B1 | * | 11/2001 | Tanaka ..................... 315/169.1 |
| 6,350,996 B1 | * | 2/2002 | Kawai et al. ............... 257/103 |
| 6,373,454 B1 | * | 4/2002 | Knapp et al. ............ 315/169.3 |

* cited by examiner

Primary Examiner—Wilson Lee
Assistant Examiner—Chuc Tran
(74) Attorney, Agent, or Firm—Young & Thompson

(57) ABSTRACT

A light emitting element capable of suppressing the deterioration of an organic thin film layer as light emitting layers is provided. The light emitting element comprises a light emitting body emitting light by impressing voltage and a rectifier connected in series with the light emitting body, the light emitting body contains the NPB thin film layer, and the rectifier has the NPB thin film layer.

14 Claims, 5 Drawing Sheets

LIGHT EMITTING ELEMENT AND PRODUCTION PROCESS THEREOF

BACKGROUND OF THE INVENTION

1. Field of the Invention

The present invention relates to a light emitting element comprising an organic thin film layer as a light emitting layer, and a production process thereof.

2. Description of the Related Art

There has been known an organic electroluminescence panel in which an organic thin film layer as a light emitting layer is sandwiched between a positive electrode and a negative electrode which were arranged in a stripe shape to mutually orthogonalized directions, and picture images are displayed by making the light emitting layers emit light by impressing voltage between the positive electrodes and negative electrodes. In a so-called simple matrix drive, fixed pixels formed at intersecting points of the positive electrodes and negative electrodes emit light by impressing signal voltage on either of the positive electrodes or negative electrodes while sequentially scanning the other electrodes and arbitrary picture images can be displayed.

However, the light emitting times of the respective pixels in one flame cannot but be shortened because of line-sequential drive in the simple matrix drive, and high momentary luminance is required in order to obtain a picture image having a fixed brightness. Accordingly, the deterioration of an organic thin film because of the heat release and light emission of light emitting layers is apt to occur, and as a result, the life of light emitting elements is shortened.

SUMMARY OF THE INVENTION

The object of the present invention is to provide a light emitting element capable of suppressing the deterioration of an organic thin film layer as light emitting layers and a production process thereof.

To solve the problem, the light emitting element comprise a light emitting body emitting light by impressing voltage, and a rectifier connected in series with the light emitting body. The emitting body contains an organic thin film layer and the rectifier has an organic thin film.

According to the invention, since the light emitting body and the rectifier connected in series are provided, the light emitting element constitutes a close circuit in the inside by the valve action of the rectifier at impressing reverse voltage, charges remaining in a capacitor which the light emitting body has are run in the light emitting layers, and the light emission of the light emitting body is kept during the time. Accordingly, the light emitting time in one scanning can be increased by a portion of a residual light emitting caused by the discharged electric charge of a capacitor, momentary luminance can be lowered, therefore the deterioration of the light emitting body is suppressed, and the long life light emitting element is obtained.

The organic thin film may be composed of the same material as the organic thin film layer. In this case, since steps of forming the insulator layer and the organic thin film layer can be commonized, the production steps of the light emitting element can be simplified and production cost can be reduced.

The respective layers constituting the rectifier and the respective layers constituting the light emitting body may be provided at a position in which they are mutually piled up. In this case, since it is not required to secure a proprietary region for the rectifier, the area of the region contributing as the light emitting layers is not suppressed, and for example, the aperture ratio as a display panel can be enlarged.

The production process of a light emitting element of the present invention comprise a light emitting body emitting light by impressing voltage, and a rectifier having an organic thin film and connected in series with the light emitting body. The production process includes a step of forming an organic thin film layer contained in the light emitting body and a step of forming an organic thin film of the rectifier.

According to the invention, since the light emitting body and the rectifier connected in series are provided, the light emitting time in one scanning can be increased at impressing reverse voltage by a portion of a residual light emitting caused by the discharged electric charge of a capacitor because of the valve action of the rectifier, momentary luminance can be lowered, therefore the deterioration of the light emitting body is suppressed, and the long life light emitting element is obtained.

The organic thin film of the rectifier may be composed of the same material as the organic thin film layer.

In this case, since the organic thin film of the rectifier is composed of the same material as the organic thin film layer, the simplification of steps and cost down can be designed.

The organic thin film later and the organic thin film of the rectifier may be formed using the same film forming method.

In this case, since the organic thin film later and the organic thin film are formed using the same film forming method, the simplification of steps and the commonization of a film forming apparatus are designed and production cost can be reduced.

In this case, an evaporation method can be used and a spin coat method can be used as the film forming methods of the organic thin film later and the insulator layer.

BRIEF DESCRIPTION OF THE DRAWING

FIG. 3A is the electrically equivalent circuit drawing of a light emitting element on an electroluminescence panel, and FIG. 3B is a drawing showing current in a light emitting element;

FIG. 4A is a sectional view of a glass substrate, FIG. 4B is a sectional view showing steps succeeding FIG. 4A, FIG. 4C is a sectional view showing steps succeeding FIG. 4B, FIG. 4D is a sectional view showing steps succeeding FIG. 4C, FIG. 4E is a sectional view showing steps succeeding FIG. 4D, FIG. 4F is a sectional view showing steps succeeding FIG. 4E, FIG. 4G is a sectional view showing steps succeeding FIG. 4F, FIG. 4H is a sectional view showing steps succeeding FIG. 4G, and FIG. 4I is a sectional view showing steps succeeding FIG. 4H;

FIG. 5B is a drawing showing the voltage wave profile when scanning speed is large.

DETAILED DESCRIPTION OF THE PREFERRED EMBODIMENT

The one embodiment in which the organic electric field light emitting element of the present invention was applied to a light emitting element constituting an electroluminescence panel, is illustrated below referring to FIG. 1 to FIG. 6.

Figure 1:
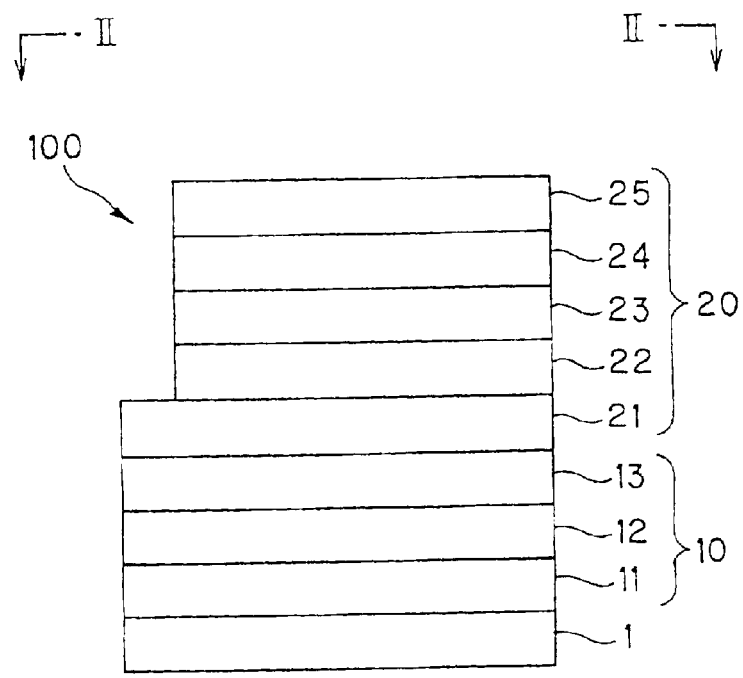
FIG. 1 is a sectional view showing a light emitting element constituting one pixel of an electroluminescence panel.
Figure 2:
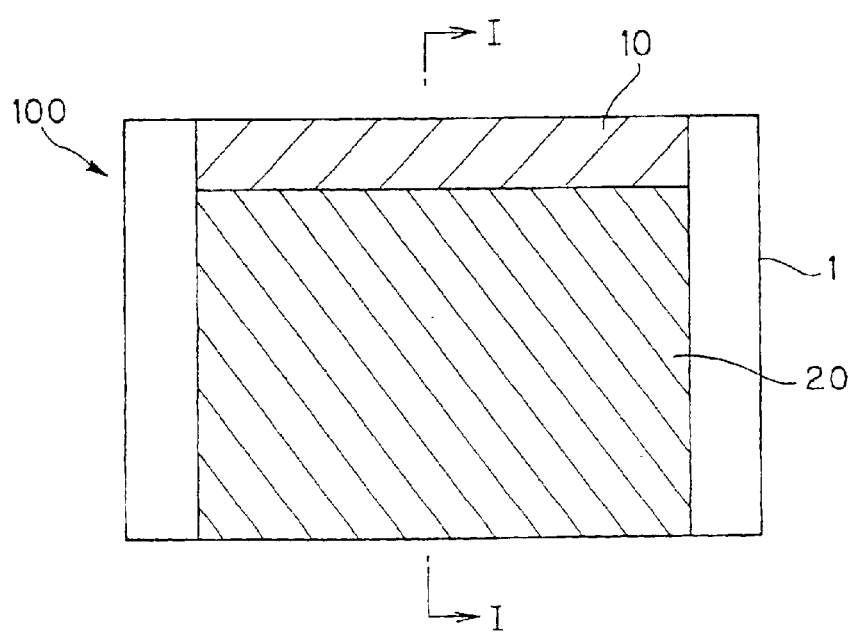
FIG. 2 is a plan view of a light emitting element viewed from II—II line direction of FIG. 1.

FIG. 1 is a sectional view showing a light emitting element constituting one pixel of an electroluminescence panel, and FIG. 2 is a plan view showing a light emitting element.

As shown in FIG. 1 and FIG. 2, the light emitting element 100 comprises a glass substrate 1, a rectifier 10 formed on the glass substrate 1, and a light emitting body 20 formed on the rectifier 10.

As shown in FIG. 1, the rectifier 10 is composed of an ITO electrode 11 formed on the surface of the glass substrate 1, a NPB (4,4'-bis[N-(1-naphthyl)-N-phenylamino]biphenyl) thin film layer 12 as an insulator layer formed on the ITO electrode 11, and an aluminum electrode 13 formed on the NPB thin film layer 12. Thus, the rectifier 10 has an organic thin film.

The light emitting body 20 is composed of an ITO electrode 21 formed on the aluminum electrode 13 of the rectifier 10, a CuPc (Copper phthalocyanine) thin film layer 22 formed on the ITO electrode 21, an NPB (4,4'-bis[N-(1-naphthyl)-N-phenylamino]biphenyl) thin film layer 23 as an organic thin film layer formed on the CuPc thin film layer 22, an ALQ (tris(β-hydroxyquinolinato)aluminum) thin film layer 24 formed on the NPB thin film layer 23, and an aluminum electrode 25 formed on the ALQ thin film layer 24.

Figure 3A:
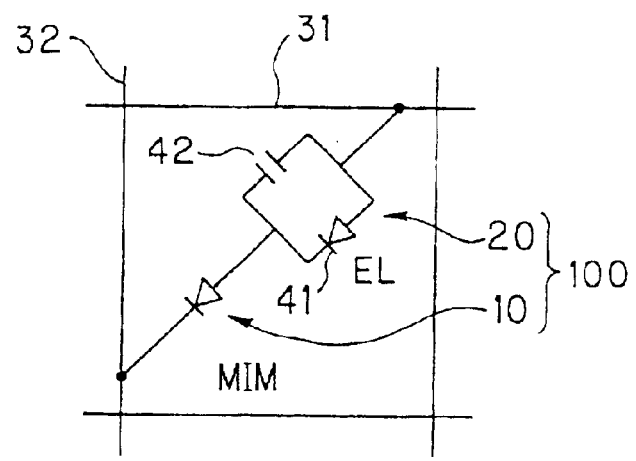
FIGS. 3A and 3B are the electrically equivalent circuit diagrams of a light emitting element.
Figure 3B:
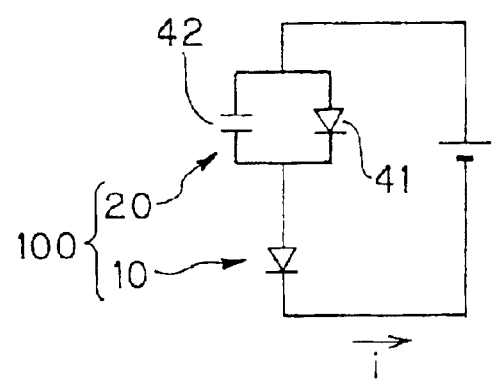

FIG. 3A and FIG. 3B are electrically equivalent circuit diagram of the light emitting element. The aluminum electrode 25 and the ITO electrode 11 are respectively connected with the positive electrode 31 (FIG. 3A) and the negative electrode 32 (FIG. 3A), the light emitting body 20 and the rectifier 10 are in a condition in which they are connected in series between the positive electrode 31 and the negative electrode 32. The light emitting body 20 is electricity-equivalently represented as that a diode 41 and a capacitor 42 are connected in parallel. As shown in FIG. 3B, current i is run over the ALQ thin film layer 24, the NPB thin film layer 23, the CuPc thin film layer 22, the ITO electrode 21, the aluminum electrode 13, and the NPB thin film layer 12 from the aluminum electrode 25 to the ITO electrode 11, by impressing a fixed voltage between the positive electrode 31 and the negative electrode 32, and the light of the ALQ thin film layer 24 is emitted. Further, the positive electrode 31 together with the aluminum electrode 25 and the negative electrode 32 together with the ITO electrode 11 may be simultaneously formed at a common step as the same layer respectively.

Then, the production process of the light emitting element 100 is illustrated referring to FIG. 4A to FIG. 4I.

Figure 4A:
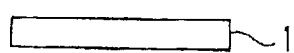
FIGS. 4A to 4I are drawings showing the production process of the light emitting element 100.
Figure 4B:
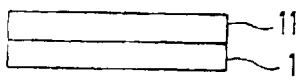
Figure 4C:
Figure 4D:
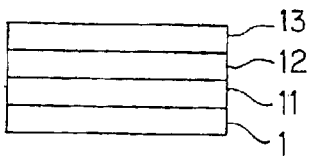
Figure 4E:
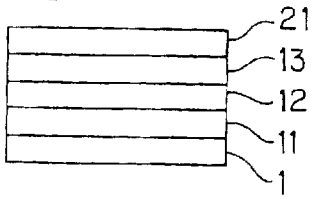

Firstly, as shown in FIG. 4A and FIG. 4B, the ITO electrode 11 is formed on the glass substrate 1 using a spattering method, and then as shown in FIG. 4C, the NPB thin film layer 12 is formed by a thickness of 150 Å on the ITO electrode 11 using an evaporation method. Then, as shown in FIG. 4D, the aluminum electrode 13 is formed by a thickness of 1000 Å on the NPB thin film layer 12 using the evaporation method, and as shown in FIG. 4E, the ITO electrode 21 is formed on the aluminum electrode 13 using the spattering method.

Figure 4F:
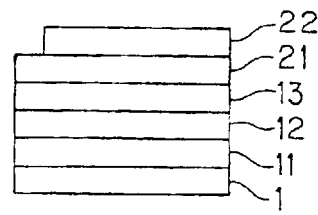
Figure 4G:
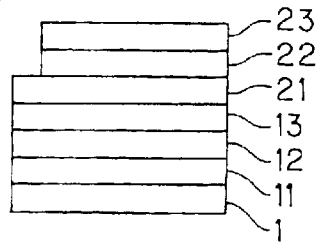
Figure 4H:
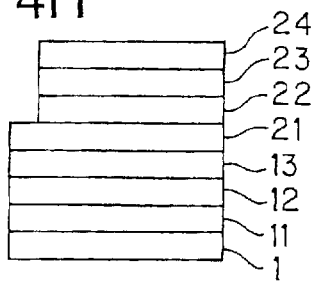
Figure 4I:
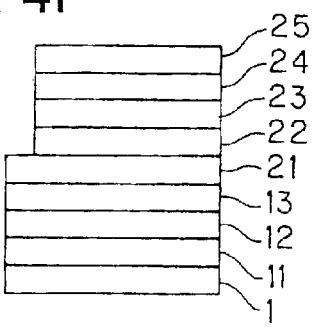

Then, as shown in FIG. 4F, the CuPc thin film layer 22 is formed by a thickness of 250 Å on the ITO electrode 21 using the evaporation method, and as shown in FIG. 4G, the NPB thin film layer 23 is formed by a thickness of 450 Å on the CuPc thin film layer 22 using the evaporation method. Successively, as shown in FIG. 4H, the ALQ thin film layer 24 is formed by a thickness of 600 Å on the NPB thin film layer 23 using the evaporation method, and as shown in FIG. 4I, the aluminum electrode 25 is formed by a thickness of 12000 Å on the ALQ thin film layer 24 using the evaporation method, therefore the light emitting element 100 is produced.

Since NPB being the same material is used for the NPB thin film layer 23 as a layer constituting the light emitting body 20, and the NPB thin film layer 12 as the insulator layer of the rectifier 10 in the light emitting element 100, the same apparatus and the same steps can be used for formation of these layers, and simplification of the production process and reduction in the production cost of the light emitting element 100 can be designed.

Further, in the light emitting element 100, since the respective layers constituting the rectifier 10 and the NPB thin film layer 23 as a layer constituting the light emitting body 20 are formed by lamination to up and down directions in FIG. 1, it is unnecessary to secure a proprietary region for the rectifier 10 on the electroluminescence panel. Accordingly, the area of the light emitting layers is not suppressed, and the aperture ratio as a display panel can be enlarged.

Then, when the light emitting element 100 is scanned by current drive according to an AC drive method, a voltage wave profile where the voltage wave is generated between electrodes at both ends of the light emitting element 100, namely the ITO electrode 11 and the aluminum electrode 25, and momentary light emitting luminance are illustrated.

Figure 5A:
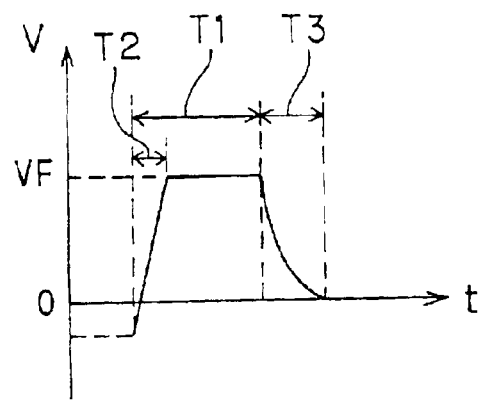
FIGS. 5A and 5B are drawings showing a voltage wave profile before and after the scanning at the AC drive, and the like, FIG. 5A is a drawing showing the voltage wave profile when scanning speed is small.

FIG. 5A is a drawing showing the voltage wave profile before and after the scanning at the AC drive, and a horizontal axis shows a time. In FIG. 5A, T1 is a scanning time, T2 is a charging time of the capacitor 42 (FIGS. 3A and 3B) of the light emitting body 20, and T3 is a discharging time of the capacitor 42. Further, VF in the drawing is a forward voltage at maximum light emission determined by the characteristics of the element.

As understood from FIG. 5A, the light emitting element 100 is scanned and current is injected by the impressed voltage to forward direction, but at first it is exhausted in charging to the capacitor 42, and there is no light emission during the charging. Then, when the charging time T2 has elapsed and the forward voltage VF is attained, the light emitting body 20 emits light. Further, when a reverse voltage is impressed after completion of the scanning, the current is not injected into the light emitting element 100 by the valve action of the rectifier 10. Since the light emitting element 100 constitutes a closed circuit in the inside and the charge which remains in the capacitor 42 is run in the diode 41, the light emission of the light emitting body 20 is continued during the interval. Accordingly, the average luminance of the element at one scanning is increased by the portion of the residual light emitting caused by the discharged charge of the capacitor 42, as compared with a conventional element.

Then, when the number of the scanning of driving the light emitting element 100 is gradually increased and the scanning speed is enhanced, the next scanning comes round at last before the charge which remains in the capacitor 42 is run into the light emitting body 20 after completion of one scanning of the light emitting element 100, and as a result, the light emitting element 100 keeps light emission.

Figure 5B:
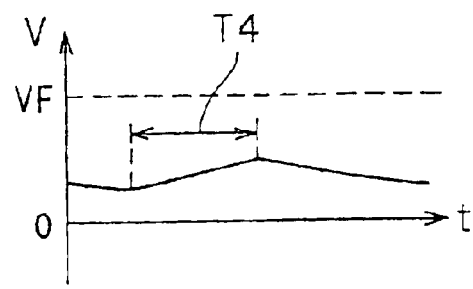

Further, since the switching of current is faster in comparison with the charging time of the light emitting element 100 in case of being scanned in high speed, the current injected into the light emitting element 100 is exhausted for charging to the capacitor 42, therefore the voltage wave profile where the voltage wave is generated at both ends of the light emitting element 100 becomes as FIG. 5B, and it does not reach to the forward voltage VF which is determined by the static property of the light emitting element 100. Further, T4 of FIG. 5B indicates the scanning time.

Figure 5C:
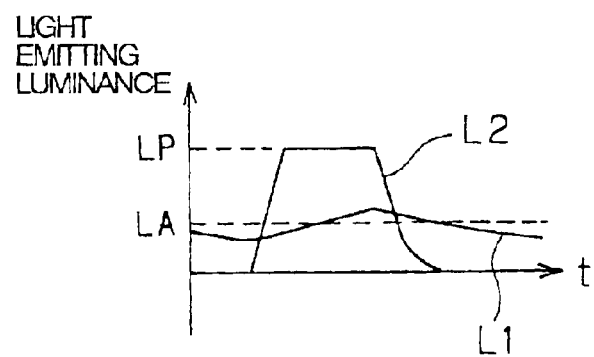
FIG. 5C is a drawing showing a momentary light emitting luminance when scanning speed was changed.

Further, as shown in FIG. 5C, the momentary light emitting luminance L1 when the light emitting element 100 is scanned at high speed does not reach to the maximum value (LP in the drawing) of the momentary light emitting luminance L2 in case of being scanned at low speed. But, the average light emitting luminance (LA in the drawing) is determined by the product of the total charge injected in the light emitting element 100 within the time in which average is determined and the quantum efficiency of the light emitting element 100. Accordingly, when the scanning duty is not changed, it does not depend on the scanning speed and comes to have a nearly constant value.

Figure 6:
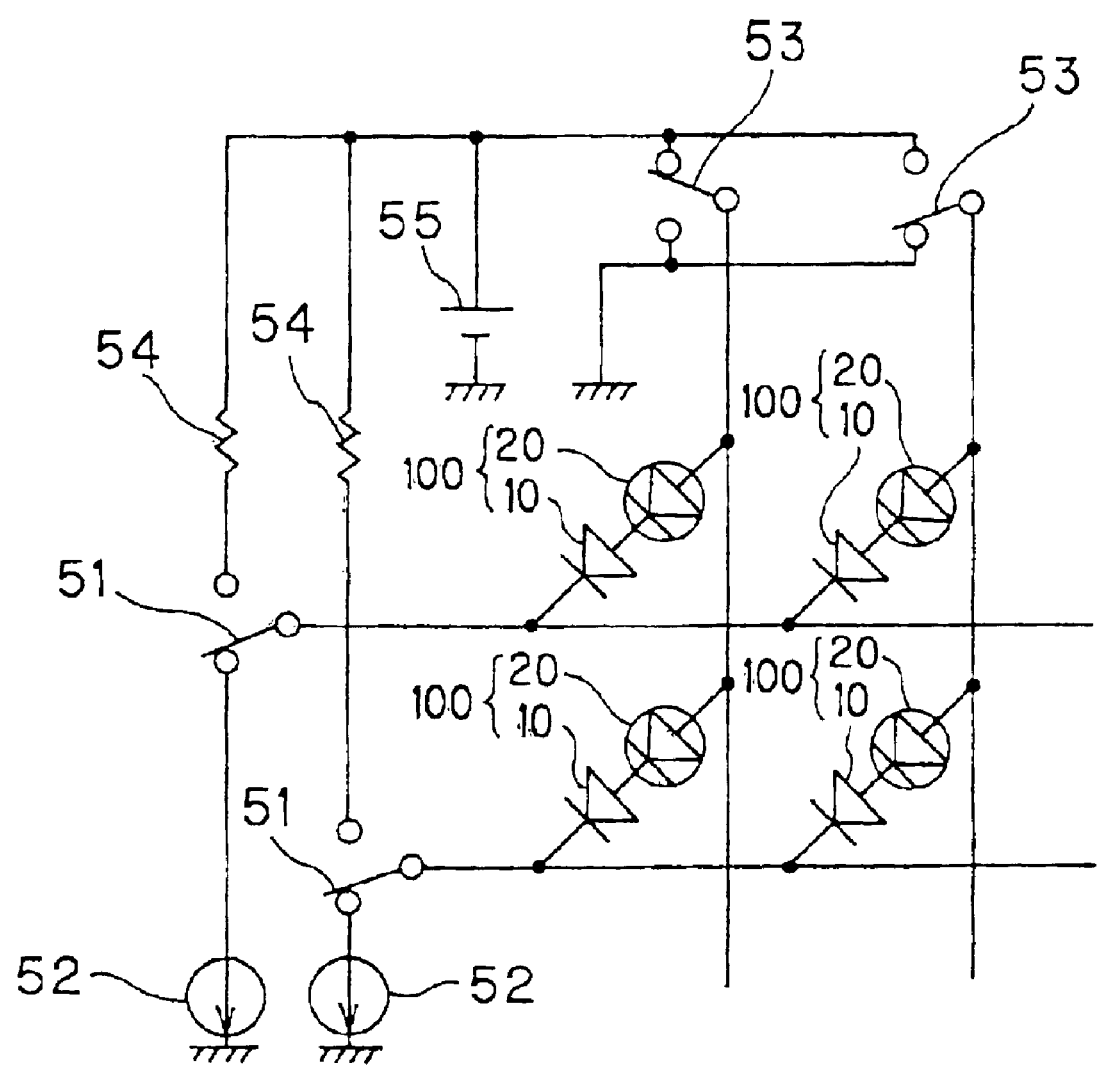
FIG. 6 is a drawing showing the equivalent circuit of an electroluminescence panel.

Then, the motion at high speed scanning of the light emitting element 100 is illustrated using FIG. 6. FIG. 6 is a drawing showing the equivalent circuit of the electroluminescence panel using the light emitting element 100. In FIG. 6, the light emitting body 20 and the rectifier 10 are connected in series, arranged in a matrix constitution of N×N (only four pieces are shown in FIG. 6), and comprise N scanning lines with which N elements are connected. Further, the voltage of the drive source 52 is simultaneously impressed to the negative electrodes of the respective light emitting elements 100 by the switch 51, the N element lines corresponding to the positive electrodes of the light emitting element 100 are scanned in order by the switch 53, and the light emitting elements 100 of the respective lines are constituted to emit light in order. Further, 54 is an external resistance in order to impress reverse voltage to the light emitting element 100 when the light emitting element 100 scanned is not emitted, and 55 is the power source of the whole drive circuit.

Hereby, when the scanning speed of the electroluminescence panel is increased and a time required for one scanning becomes shorter than the discharging time of the capacitor 42 of the respective elements, the next scanning comes round before the charge which remains in the capacitor 42 of the light emitting element 100 which constitutes the respective scanning lines is run into the light emitting body 20, and as a result, the light emitting element 100 keeps light emission. Accordingly, since the charge which is charged in the capacitor 42 of the respective light emitting elements 100 is used for the light emission of the light emitting element 100 without being extracted to outside, the light emission efficiency is enhanced. Further, since the peak luminance of the respective light emitting elements 100 becomes nearly the average luminance, the load weighed on the light emitting element 100 is reduced, and the respective light emitting elements 100 prolong it's life span greatly. Further, since the peak voltage generated at the respective light emitting elements 100 gets along at the average voltage required for generating average luminance, the voltage of the power source 55 of the drive circuit can be suppressed low, the suppression of consumed electric power can be designed, and the breakage of the light emitting element 100 caused by over voltage can be prevented.

In the above-mentioned embodiment, NPB is used as the insulator layer material of the rectifier, but other organic materials such as CuPc (Copper Phtharocyanine), MTDATA (4,4', 4"-tris[N-(3-methylphenyl)-N-phenylamino] triphenylamine), TPD (triphenyl diamine) and the like may be used.

Further, in the above-mentioned embodiment, the NPB thin film layer 23 constituting the light emitting body 20 and the NPB thin film layer 12 as the insulator layer of the rectifier 10 are formed using the same material, but these layers may be composed of different organic materials.

Further, in the above-mentioned embodiment, the respective layers constituting the light emitting body 20 and the respective layers constituting the rectifier 10 are formed by lamination, but the region for forming the rectifier and the region of the light emitting part main body may be separately provided.

In the above-mentioned embodiment, the NPB thin film layer 12 as the insulator layer of the rectifier 10 and the NPB thin film layer 23 as the layer constituting the light emitting body 20 are formed by an evaporation method, but both may be formed by a spin coat method. In this case, after coating a photo resist on the respective layers by spin coat, the resist is formed in a fixed form by the steps of exposure and development, and further, a fixed form can be obtained by dissolving the exposed portions of the respective layers by the development treatment.

In the above-mentioned embodiment, an organic electroluminescence device was exemplified, but the present invention can be applied to not only the organic electroluminescence device, but also other self-light emitting type device such as a light emitting diode having a capacitor in parallel with the light emitting body as the equivalent electric circuit, and the like. The capacitor which is connected in parallel with the light emitting body is formed in the light emitting element and the capacity may be intentionally added to the light emitting body.

According to the light emitting element of the present invention, since the rectifier connected in series with the light emitting body is provided, the light emitting element constitutes a closed circuit in the inside by the valve action of the rectifier at impressing a reverse voltage, the charge remaining in the capacitor which the light emitting body has is run into the light emitting layer, therefore the light emission of the light emitting body is continued during the interval. Accordingly, the light emitting time at one scanning is increased by the portion of the residual light emitting caused by the discharged charge of the capacitor, momentary luminance can be lowered, therefore the deterioration of the light emitting body is suppressed and the long life light emitting element is obtained.

Further, according to the light emitting element of the present invention, since the insulator layer is formed by the same material as the organic thin film layer, and the organic thin film layer and the insulator layer are formed using the same film forming method, the simplification of steps and the commonization of a film forming device are designed, and production cost can be reduced.

The entire disclosure of Japanese Patent Application No. 2000-67185 filed on Mar. 7, 2000 including the specification, claims, drawing and summary is incorporated herein by reference in its entirety.

What is claimed is:
1. A light emitting element comprising;
   a light emitting body emitting light by impressing voltage, and a rectifier connected in series with the light emitting body;

wherein the emitting body contains an organic thin film layer and the rectifier has an organic thin film, and wherein the light emitting body and the rectifier are a lamination.

2. A light emitting element according to claim 1;

wherein the organic thin film of the rectifier is composed of the same material as the organic thin film layer.

3. A light emitting element according to claim 1;

wherein respective layers constituting the rectifier and respective layers constituting the light emitting body are provided at positions in which they are mutually piled up.

4. A light emitting element according to claim 2;

wherein respective layers constituting the rectifier and respective layers constituting the light emitting body are provided at positions in which they are mutually piled up.

5. A production process of a light emitting element comprising a light emitting body emitting light by impressing voltage, and a rectifier having an organic thin film and connected in series with the light emitting body;

wherein the production process includes;

a step of forming an organic thin film layer contained in the light emitting body, a step of forming an organic thin film of the rectifier, and a step of laminating the light emitting body on top of the rectifier.

6. A production process of a light emitting element according to claim 5;

wherein the organic thin film of the rectifier is composed of the same material as the organic thin film layer.

7. A production process of a light emitting element according to claim 5;

wherein the organic thin film layer and the organic thin film of the rectifier are formed using the same film forming method.

8. A production process of a light emitting element according to claim 6;

wherein the organic thin film layer and the organic thin film of the rectifier are formed using the same film forming method.

9. A production process of a light emitting element according to claim 7;

wherein an evaporation method is used as the film forming method.

10. A production process of a light emitting element according to claim 8;

wherein an evaporation method is used as the film forming method.

11. A production process of a light emitting element according to claim 7;

wherein a spin coat method is used as the film forming method.

12. A production process of a light emitting element according to claim 8;

wherein a spin coat method is used as the film forming method.

13. A light emitting element comprising:

a substrate;

a rectifier on top of said substrate;

a light emitting body on top of said rectifier, wherein said light emitting body emits light by impressing voltage, and wherein both said rectifier and said light emitting body include an organic thin film.

14. The light emitting element as claimed in claim 13, wherein, in plan view, an entirety of said light emitting body is within said rectifier.

* * * * *